(12) United States Patent
Waller, Jr.

(10) Patent No.: US 7,957,546 B2
(45) Date of Patent: Jun. 7, 2011

(54) MULTI-CHANNEL NOISE REDUCTION SYSTEM WITH DIRECT INSTRUMENT TRACKING

(76) Inventor: James K. Waller, Jr., Clarkston, MI (US)

( * ) Notice: Subject to any disclaimer, the term of this patent is extended or adjusted under 35 U.S.C. 154(b) by 1571 days.

(21) Appl. No.: 11/302,296

(22) Filed: Dec. 13, 2005

(65) Prior Publication Data

US 2007/0133825 A1 Jun. 14, 2007

(51) Int. Cl.
*G10H 1/00* (2006.01)
(52) U.S. Cl. .......................................... 381/118; 84/621
(58) Field of Classification Search .................. 381/118, 381/120, 94.1–94.4, 106, 104, 119, 61, 63, 381/58; 84/1, 600, 723, 737, 267, 741, 621, 84/683, 691, 728
See application file for complete search history.

(56) References Cited

U.S. PATENT DOCUMENTS

| | | | |
|---|---|---|---|
| 3,992,584 A * | 11/1976 | Dugan | ............................ 381/82 |
| 4,647,876 A | 3/1987 | Waller, Jr. | |
| 4,672,671 A | 6/1987 | Kennedy | |
| 4,696,044 A | 9/1987 | Waller, Jr. | |
| 4,881,047 A | 11/1989 | Waller, Jr. | |
| 4,893,099 A | 1/1990 | Waller, Jr. | |
| 5,124,657 A | 6/1992 | Waller, Jr. | |
| 5,263,091 A | 11/1993 | Waller, Jr. | |
| 5,404,498 A | 4/1995 | Tanaka et al. | |
| 5,493,617 A | 2/1996 | Waller, Jr. | |
| 5,789,689 A | 8/1998 | Doidic et al. | |
| 6,522,752 B1 * | 2/2003 | Smith | ............................ 381/61 |
| 6,944,305 B2 * | 9/2005 | Waller | .......................... 381/104 |
| 2002/0154786 A1 * | 10/2002 | Waller, Jr. | ..................... 381/104 |

OTHER PUBLICATIONS

International Search Report and Written Opinion, issued by International Searching Authority (Autorized Officer: B. Copenheaver) on Feb. 22, 2008 (9 pgs).

* cited by examiner

*Primary Examiner* — Vivian Chin
*Assistant Examiner* — Lun-See Lao
(74) *Attorney, Agent, or Firm* — Gable Gotwals

(57) ABSTRACT

A multi-channel noise reduction system provides improved noise reduction with direct instrument tracking of all channels. In a two channel noise reduction system, both channels detect and track the input level and dynamic range of the guitar directly with one channel of dynamic noise reduction between the guitar and the input of a guitar amplifier to eliminate the noise of the instrument and another channel of noise reduction connected in the effects loop of the guitar amplifier. Multiple channels of noise reduction can be implemented with separated threshold controls and with low level expansion and dynamic filtering being combined so as to detect and track the input level and dynamic range of the guitar directly. A buffer amplifier can be used to feed the direct guitar signal to the detectors of the noise reduction system and the input of a stereo guitar system.

16 Claims, 3 Drawing Sheets

MULTI-CHANNEL NOISE REDUCTION SYSTEM WITH DIRECT INSTRUMENT TRACKING

BACKGROUND OF THE INVENTION

The present invention relates generally to a method and system for providing improved tracking for musical instrument noise reduction systems and more particularly concerns such tracking in high gain guitar noise reduction systems. Noise reduction has continued to evolve and improve for many years providing the musician ongoing improvements in sound quality and reduced noise in live performances. Numerous patents have been issued for improvements in the area of noise reduction technology, including many of my inventions covered under U.S. Pat. Nos. 4,647,876, 4,696,044, 4,881,047, 4,893,099, 5,124,657, 5,263,091, 5,404,498 and 5,493,617. One benefit of my recently issued U.S. Pat. No. 6,944,305 is tracking the envelope of the input signal to provide a variable release response based on tracking the decay of the input signal.

While these improvements have offered a major advance in the overall performance of noise reduction for musicians, and in particular the guitarist, there has been a lack of improvement available in reducing the noise, particularly in extremely high gain applications. When the noise reduction system has the ability to track the level and wide dynamic range of the instrument directly, it's easy to have a controlled, and accurate response from the noise reduction system. However, typical modern guitarists use extremely high gain and distortion as a major part of their sound palate. When driving any guitar preamplifier into extreme distortion, the output signal becomes highly compressed and the dynamic range is reduced to as little as 5 to 10 decibels. This reduction in dynamic range makes it extremely difficult, if not impossible, for a noise reduction system to determine the difference between the background noise and the desirable instrument signal. The most common place to inset a noise gate or noise reduction system is in the effects loop of the instrument amplifier, which allows the noise reduction system to improve the dynamic range of the post distort signal. While this will reduce the background noise of the system, it also requires switching the noise reduction out of the signal path when the musician changes from a high gain distortion setting to a clean un-distorted sound. If the noise reduction system is not switched out, the threshold of the noise reduction system will be set so high that low-level signals will be undesirably truncated or attenuated. The improvements of the '305 patent finally allow the guitarist to eliminate the common problem of squealing feedback between short staccato notes caused by using extremely high gain in the guitar preamplifier if the noise reduction system is used between the guitar and the input of the amplifier. Noise reduction systems based on the '305 patent, if connected between the instrument and the preamplifier, will allow extremely quick response reducing the gain of the instrument before feedback occurs by tracking the wide dynamic range of the guitar. However, when the noise reduction system is inserted between the instrument and the input of the preamplifier, there is no effect of reducing the noise at the output of the high gain preamplifier. Using two channels of noise reduction will improve this problem but, as described above, requires the noise reduction system at the output of the preamplifier to operate with as little as 5 to 10 decibels of dynamic range and also requires the system to be switched out to avoid the side effect of chopping off any low level signal in a low gain setting.

It is, therefore, an object of this invention to provide a noise reduction system which does not track the small dynamic range at the output of a high gain guitar preamplifier. It is also an object of the invention to provide an improved multi-channel noise reduction system in which the level detection circuit for all channels tracks the instrument directly and allows one noise reduction channel to be placed between the instrument and the input of the guitar preamplifier and a second noise reduction channel to be inserted in the effects loop of the typical guitar amplifier. Another object of the current invention is to allow the guitar amplifier to be switched from a high gain setting to a low gain or clean setting without any need to change the threshold setting of the noise reduction system. Yet another object of the invention is to provide a system where both low-level downward expansion and dynamic low pass filtering as a composite noise reduction audio processing block for multiple channels can track the instrument directly. Yet another object of the current invention is to provide the ability to have multiple audio channels of noise reduction for use in a stereo or multi-channel guitar system where all of the audio channels detection circuit track the instrument directly and the audio signal can be inserted after the use of a high gain preamplifier.

SUMMARY OF THE INVENTION

In accordance with the present invention, a system and method is disclosed for improving multi-channel noise reduction allowing all channels to detect and track the instrument directly.

The musical instrument output signal is level detected to derive a dc control signal and also to an instrument amplifier which has an effects loop circuit. The output of the effects loop circuit is varied in response to the dc control signal. The user may vary the threshold for level detection of the instrument output signal.

In one embodiment, the musical instrument output signal is fed via a first audio path to an instrument amplifier having an effects loop circuit connected to a second audio path and the outputs of the first and second audio paths are both varied in response to the dc control signal.

In another embodiment, the musical instrument output signal is fed via a first audio path to an instrument amplifier having an effects loop circuit connected to a second audio path and the outputs of the first and second audio paths. The musical instrument output signal is twice level detected to derive first and second dc control signals. The outputs of the first and second audio paths are varied in response to the first and second dc control signals, respectively, so that separate threshold controls can be applied in each audio path.

In yet another embodiment the instrument output signal is fed to an instrument amplifier having a right effects loop circuit connected to a first audio path and a left effects loop circuit connected to a second audio path. The outputs of the first and second audio paths are varied in response to the dc control signal with a single level detection threshold control.

In every embodiment, the instrument output is level detected directly and the derived control signal applied to the effects loop circuit.

BRIEF DESCRIPTION OF THE DRAWINGS

Other objects and advantages of the invention will become apparent upon reading the following detailed description and upon reference to the drawings in which.

While the invention will be described in connection with several preferred embodiments, it will be understood that it is not intended to limit the invention to those embodiments. On the contrary, it is intended to cover all alternatives, modifications and equivalents as may be included within the spirit and scope of the, invention as defined by the appended claims.

DETAILED DESCRIPTION OF THE INVENTION

Figure 1A:
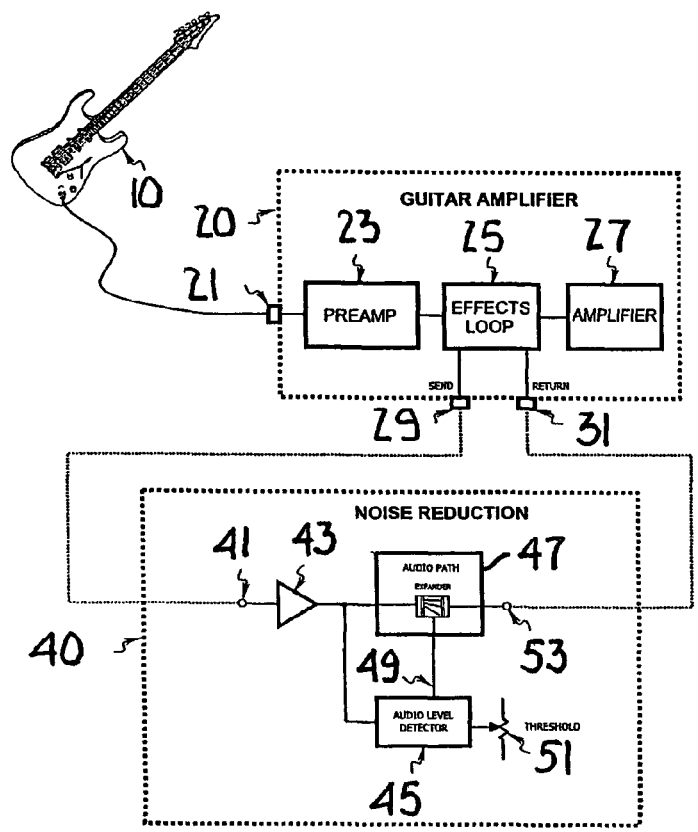
FIG. 1A is a block diagram of a prior art system incorporating a noise reduction system used in the effects loop of a typical guitar amplifier.

Turning first to FIG. 1A, a block diagram of a prior art system is shown. The typical guitar amplifier used today is either a guitar head, which incorporates the circuitry shown as the guitar amplifier 20, or a combo amplifier, which will also include the speaker in the cabinet together with all the components of the guitar amplifier 20. In either case, the output of the guitar 10 is connected to the input 21 of the guitar amplifier 20. The guitar amplifier 20 includes a preamp 23, an effects loop circuit 25 and a power amplifier 27 serially connected as shown. The noise reduction system 40 is connected into the effects loop circuit 25 of the guitar amplifier 20 with the send output 29 of the guitar amplifier 20 connected to the input 41 of the noise reduction system 40. The noise reduction input signal is buffered by a buffer amplifier 43 and drives both the level detector 45 and the input of the audio path 47 which incorporates a VCA configured as a low level downward expander. The circuitry used for the noise reduction system 40 is well known to those skilled in the art and is disclosed in many of my previous patents listed in the background of the current invention.

Continuing to look at FIG. 1A, the output 49 of the level detector 45 is adjusted by a threshold control 51. The detector output signal is applied to a voltage-controlled amplifier in the audio path 47. The output 53 of the audio path 47 is fed to the return input 31 of the guitar amplifier 20. While this system is effective at removing noise from the guitar 10 and gain noise generated by the high gain preamplifier 23, it suffers from several problems in operation. The preamplifier 23, when set for high gain use, will provide compression of the signal to the guitar amplifier 20 and as a result will greatly reduce the dynamic range of the guitar signal appearing at the output of the preamplifier 23. This requires the noise reduction system 40 to operate with the greatly reduced dynamic range that appears at the output of the preamplifier 23. Setting the threshold of the noise reduction system 40 becomes critical for correct operation of the noise reduction system 40 and any change in the gain or tone of the preamp 23 will require an appropriate change in the threshold 51 of the noise reduction system 40. When the musician changes or switches the settings of the guitar amplifier 20, the noise reduction system 40 needs to be re-adjusted or switched out of the signal. This configuration is not extremely effective at eliminating the typical squealing feedback that is associated with the extremely high gain guitar amplifiers or worse, provides little impact if the guitarist uses an external overdrive pedal or circuit between the guitar 10 and the input 21 of the guitar amplifier 20.

Figure 1B:
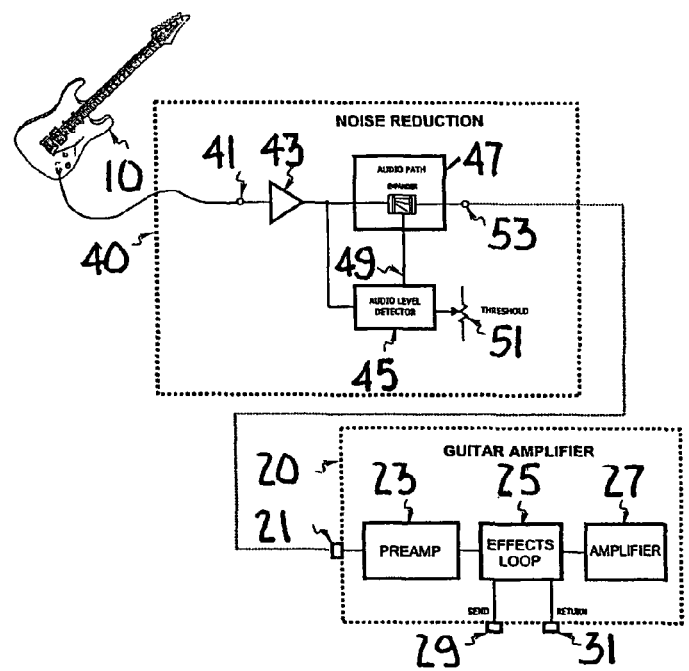
FIG. 1B is a block diagram of a prior art system incorporating a noise reduction system used between the guitar and the input of a typical guitar amplifier.

Considering FIG. 1B, in an alternative prior art method the noise reduction system 40 is inserted in the signal path between the guitar 10 and the guitar amplifier 20. In this configuration, the output of the guitar 10 is connected to the input 41 of the noise reduction system 40 and the output 53 is connected to the input 21 of the guitar amplifier 20. The noise reduction system 40 detects the larger dynamic range of the guitar signal before any compression of the signal that would take place in the preamp 23 and allows the musician to change settings on the guitar amplifier 20 without requiring any changes in the noise reduction threshold 51. Noise reduction systems which incorporate the advantages of the improved tracking response of the invention described in my '305 patent will also eliminate the common high gain squealing feedback associated with playing staccato notes. However, since the noise reduction circuit 40 is before the output of the high gain preamplifier 23, it will not be effective at reducing the noise of the preamp circuit 23.

Figure 1C:
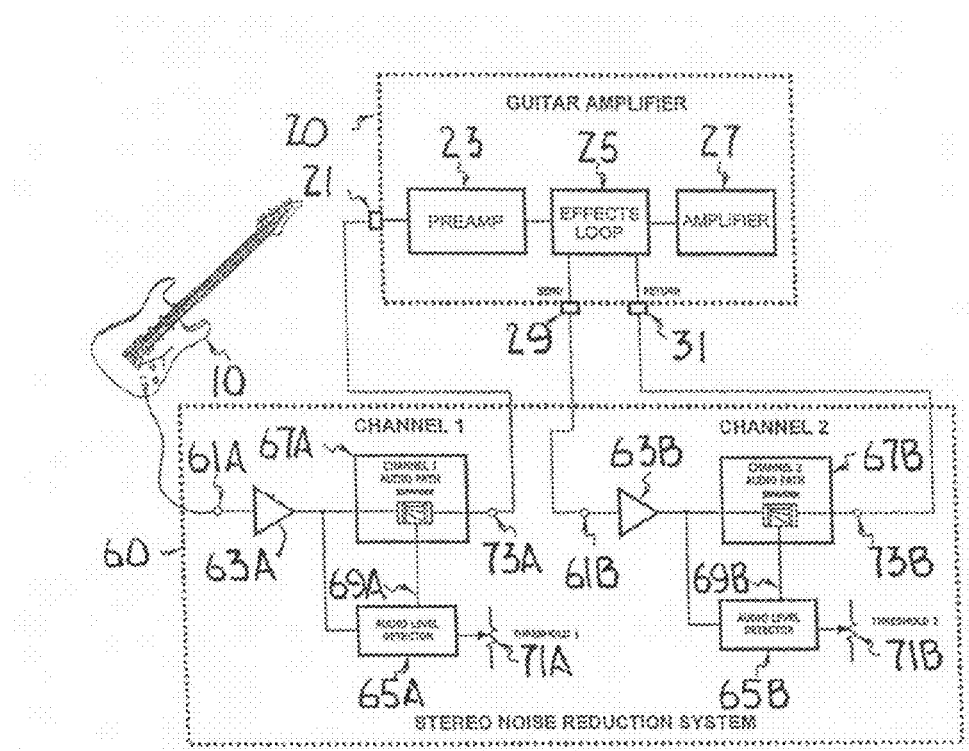
FIG. 1C is a block diagram of a prior art system incorporating a stereo noise reduction system with one channel used between the guitar and the input of a typical guitar amplifier and a second channel inserted in the effects loop of the typical guitar amplifier.

Turning to FIG. 1C, in yet another prior art method, a stereo noise reduction system 60 is used in conjunction with a typical guitar amplifier 20. The channel 1 audio path 65A is inserted between the guitar 10 and the input 21 of the guitar amplifier 20 and the channel 2 audio path 65B is inserted in the effects loop circuit 25 of the guitar amplifier 20. The guitar 10 is connected to the input 61A of the noise reduction system 60 and the send output 29 of the effects loop circuit 25. Two separate threshold settings 71A and 71B are required and the channel 2 noise reduction circuit will require a change in the setting of the threshold 71B if the guitar preamplifier 23 settings are changed from high gain to low gain or if the tone of the preamplifier 23 is changed by the user. This is done by use of two audio level detectors 65A and 65B which receive inputs from buffer amplifiers 63A and 63B. The detector output signals 49A and 49B control the audio outputs 73A and 73B. The output 73A of the channel 1 audio path 67A is connected to the input 21 of the guitar amplifier 20. The output of the channel 2 audio path 67B is connected to the return input 31 of the effects loop circuit 25. Most musicians will switch the effects loop circuit 23 in when they are using a high gain setting and out when using a lower gain setting.

Figure 2:
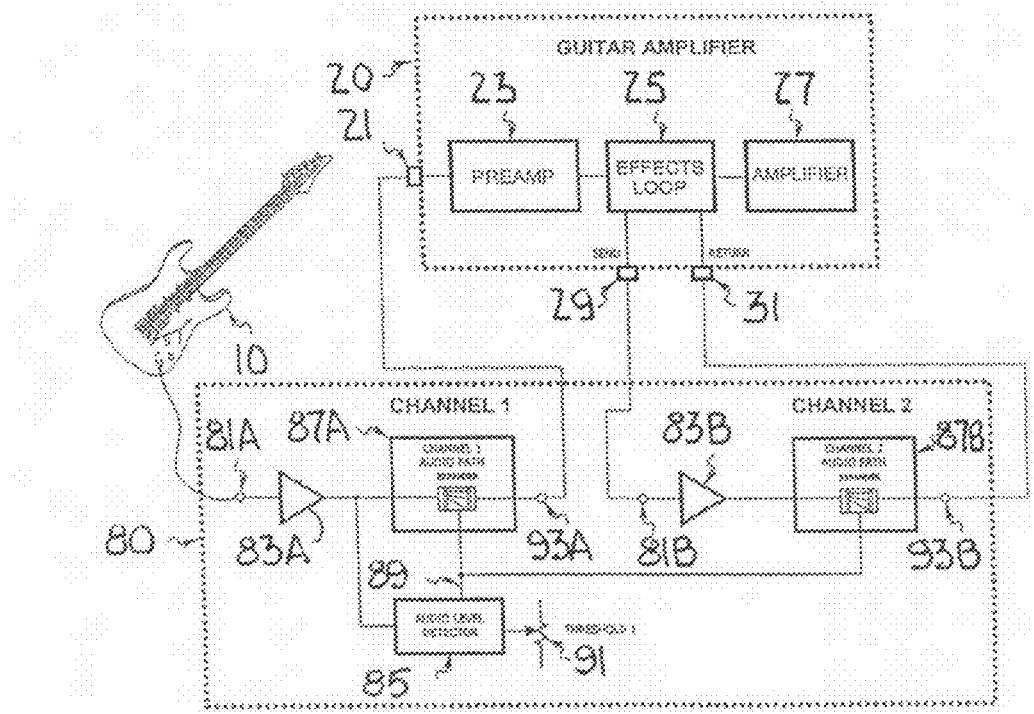
FIG. 2 is a block diagram of a first embodiment of the invention in which a single level detection circuit controls multiple channels of noise reduction with one channel of the noise reduction system between the guitar and the input of the guitar amplifier and a second channel of the noise reduction system inserted in the effects loop of the typical guitar amplifier.

Looking at FIG. 2, a first embodiment of the invention is shown. The guitar 10 is connected to the input 81A of the noise reduction system 80. The input signal is buffered by a buffer amplifier 83A and the output signal of the buffer amplifier 83A drives both the input of the channel 1 audio path 87A and its audio level detector 85. Audio level detectors, described in detail in my above listed patents and known by those of ordinary skill in the art, are discussed only at the block level in this description. Various types of level detectors can be used, including peak, averaging and RMS detectors. The output 87A of the level detector 85 is varied by the threshold control 91, allowing the user to define the threshold level at which noise reduction begins. The output 87A of the level detector 85 feeds the control port of both the audio paths 87A and 87B. Audio paths 87A and 87B each consist of a VCA (voltage controlled amplifier) configured as a low-level downward expander. Voltage controlled amplifiers, known by those of ordinary skill in the art and described in detail in my previous patents, are discussed only at the block level for this description. One of the most common voltage controlled amplifiers in use is part number 2181LC by THAT Corporation. The output 93A of the channel one audio path 87A is connected to the input 21 of the guitar amplifier 20. The output of the preamp 23 in the guitar amplifier 20 feeds the effects loop circuit 25, which allows the user to connect an external signal processing device such as a noise reduction system. The output 29 of the effects loop 25 is connected to the input 81B of the noise reduction system 80, buffered by a buffer amplifier 83B and fed to the input of the channel 2 audio path 87B. The output 93B of the channel 2 audio path 87B feeds the return input 31 of the effects loop circuit 25 in the guitar amplifier 20. The output of the effects loop circuit 25 feeds the input of the power amplifier 27. In use, the output of the power amplifier 27 will drive an external speaker cabinet preferred by the guitarist in order to provide audible sound.

Continuing to look at FIG. 2, in operation, the output level of the guitar 10 is detected by the audio level detector 85, which converts the audio input signal into a DC signal 89 to control the voltage controlled amplifiers in the audio paths 89A and 89B. The threshold adjustment 91 of the level detector 85 allows the guitarist to set the threshold of the noise reduction system 80 so as to eliminate all background noise from the guitar 10 and any preamplifier high gain noise in the preamp 23. Since the audio level detector 85 detects and tracks the signal direct from the guitar 10 and generates the control voltage 89 used to control the downward expanders in both audio paths 87A and 87B, changes in the gain and or tone of the preamp 23 will not require any user adjustment of the setting of the threshold 91. Furthermore, he level detector 85 will detect the large dynamic range available from the guitar 10, making the operation of the channel 2 audio path 87B of the noise reduction circuit 80 connected in the effects loop circuit 25 far more responsive signal from the guitar 10. The embodiment may also include the teachings of my '305 patent, which will make the release response characteristic of the noise reduction system 80 responsive to the decay envelope of the guitar 10 and will also add considerable transparency to the noise reduction system 80.

Figure 3:
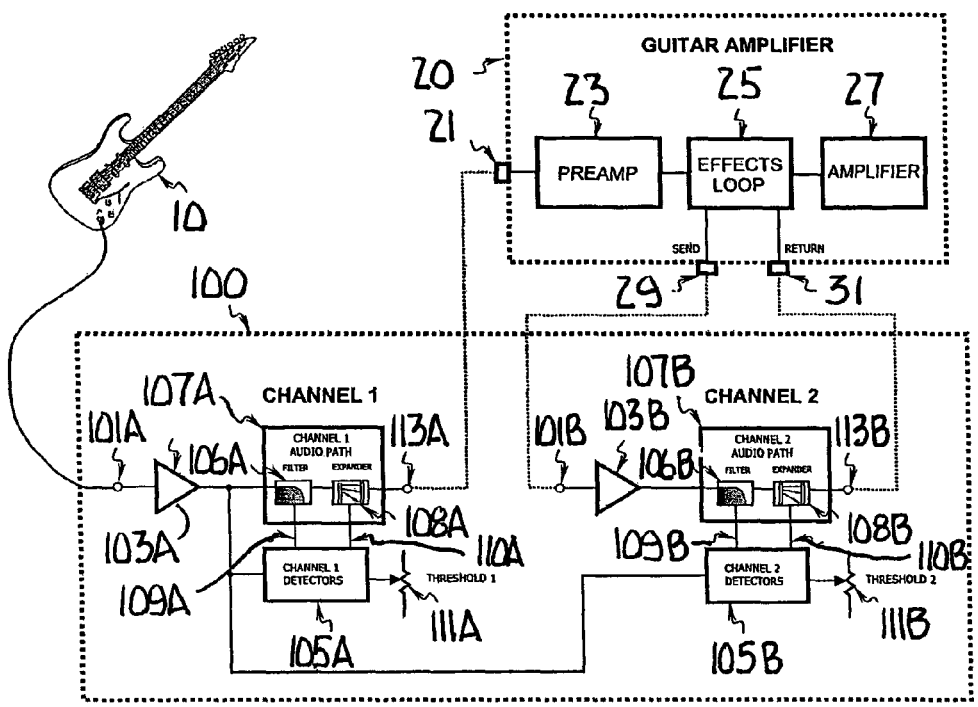
FIG. 3 is a block diagram of a second embodiment of the invention in which dual level detection circuits control multiple channels of noise reduction incorporating both low level expansion and dynamic filtering, with one channel of the noise reduction system used between the guitar and the input of the guitar amplifier and a second channel of the noise reduction system inserted in the effects loop of the typical guitar amplifier.

Turning to FIG. 3, in a second embodiment of the invention a multi-channel noise reduction system 100 incorporates the effect of both low level downward expansion and dynamic low pass filtering with dual channel level detectors 105A and 105B and threshold controls 111A and 111B. A detailed description of the operation of dynamic filtering is disclosed in my U.S. Pat. Nos. 4,647,876, 4,696,044, 5,124,657 and 5,596,646. Each of the channel level detectors 105A and 105B includes two level detectors, the first for controlling the response of the dynamic filters 106A and 106B, respectively, and the second for controlling the response of the voltage controlled amplifiers 108A and 108B, respectively. It will be apparent to those of ordinary skill in the art that single threshold controls 111A and 111B can be implemented for each pair of level detectors. In operation, the output of the guitar 10 is fed to the input 101A of the noise reduction system 100 and buffered by the buffer amplifier 103A. The output of the buffer amplifier 103A feeds the input of the channel 1 audio path 107A, which includes both the dynamic filter 106A and the voltage controlled amplifier 108A. The output of the buffer amplifier 103A also feeds the inputs of both groups of level detectors in the channel level detectors 105A and 105B. The threshold controls 111A and 111B allow the user to adjust for the threshold set points of the level detectors 105A and 105B, respectively. The output 113A of the channel 1 audio path is connected to the input 21 of the guitar amplifier 20 and fed to the input of the preamp 23. The send output 29 of the effects loop circuit 25 feeds the input 101B of the noise reduction system 100. The signal at the input 101B is buffered by the buffer amplifier 103B and fed to the channel 2 audio path 107B. The output 113B of the channel 2 audio path 107B is connected to the return input 31 of the effects loop circuit 25.

Continuing to look at FIG. 3, in operation the output level of the guitar 10 is buffered by the buffer amplifier 101A and then detected by audio level detectors contained in the channel detectors 105A and 105B to provide DC control voltages 109A and 109B which control the dynamic filters 106A and 106B, respectively, and DC control voltages 110A and 110B for controlling the voltage controlled amplifiers 108A and 108B, respectively. The threshold adjustment 111A allows the guitarist to adjust the threshold set point for the level detector 105A. The guitarist can, therefore, set the noise reduction threshold of the channel 1 audio path 107A so as to eliminate all background noise, hum and buzz from the guitar 10 before the signal is fed to the input 21 of the guitar amplifier 20. The channel 1 audio path 106A of the noise reduction system 100 will also allow the guitarist to set this threshold 111A so as to eliminate high gain squealing that may occur when playing short staccato notes with a high gain setting for the preamp 23. Similarly, the threshold adjustment 111B allows the guitarist to adjust the threshold set point for the level detector 105B. The guitarist can, therefore, set the noise reduction threshold of the channel 2 audio path 107B so as to eliminate any high gain noise, hiss and hum present in the output of the preamp 23.

The embodiment of FIG. 3 allows the user to more precisely set the threshold for both the operation of the channel 1 audio path 107A for reducing noise picked up directly by the guitar 10 and the threshold for the operation of the channel 2 audio path 107B, which controls the noise produced by the guitar preamp circuit 23. Since both the channel 1 and the channel 2 level detectors 105A and 105B track the input of the guitar 10 directly, both noise reduction channels respond to the full dynamic range of the guitar 10, allowing the user to make adjustments to the guitar amplifier 20 without any need to change the threshold settings of the noise reduction system 100. The embodiment of FIG. 3 may also include the teachings of my '305 patent, which will make the release response characteristic of the noise reduction system 100 responsive to the decay envelope of the guitar 10 and will also add considerable transparency to the noise reduction system 100.

Figure 4:
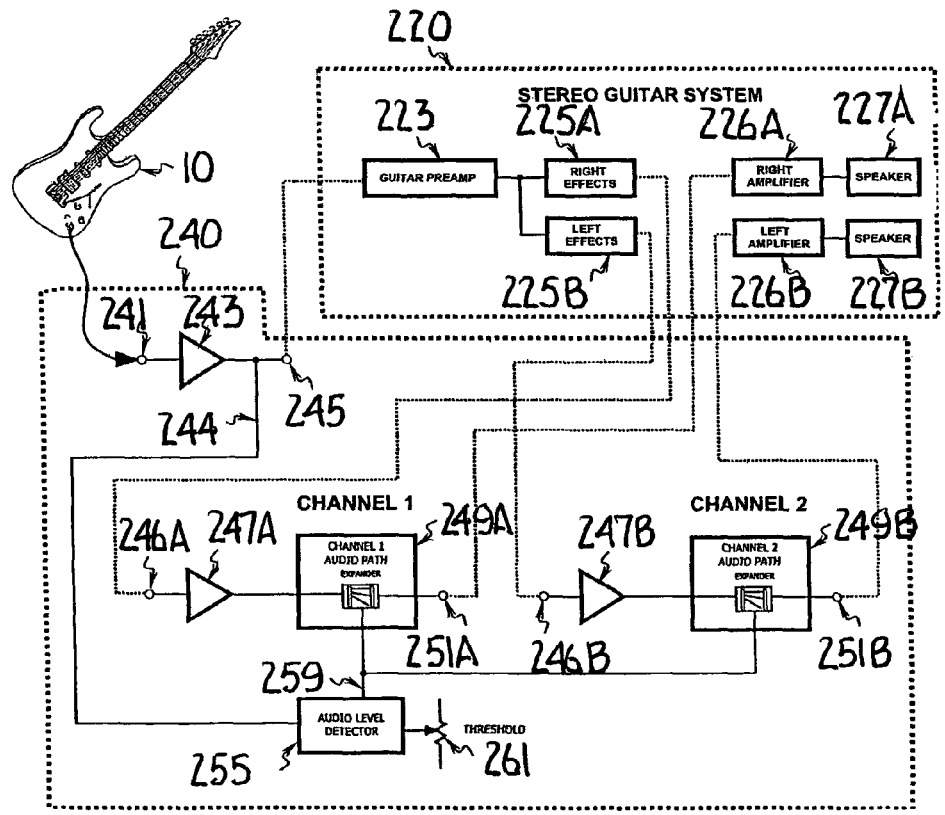
FIG. 4 is a block diagram of another embodiment of the invention for use in a true stereo guitar system in which the guitar plugs directly into the noise reduction system and a buffered output drives both the input of the stereo guitar system and an internal level detector for controlling multiple channels of noise reduction which are used after the guitar signal is split for stereo.

Looking now at FIG. 4, another embodiment of the invention allows operation with a true stereo guitar system 220. The embodiment of FIG. 4 is illustrative and one of ordinary skill in the art will understand that there are endless possible configurations of equipment that can be used in a custom guitar system. For years guitarists have built high performance stereo guitar systems using separate components. Typically these consist of 19 inch rack-mount components such as guitar preamplifiers, compressors, equalizers, effects processors and many other separate components. In some systems the musician will also use multiple guitar preamplifiers to generate a stereo signal. As shown in FIG. 4, the output of the guitar 10 is connected to the input 241 of the noise reduction system 240 and buffered by a buffer amplifier 243A which allows the noise reduction system 240 to capture the high impedance input signal 244 of the guitar 10 to feed the input of the audio level detector 255. It will be apparent to those of ordinary skill in the art that the noise reduction system 200 may also include multiple level detectors and multiple threshold controls as shown in FIG. 3, multiple threshold controls, and may further implement both processes of downward expansion and dynamic filtering as shown in FIG. 3. As seen in FIG. 4, the output 245 of the buffer amplifier 243 is connected to the input of the guitar preamp 223 of the stereo guitar system 220. The output of the preamp 223 feeds two separate effects paths including right effects circuit 225A and left effects circuit 225B. As described above, in practice the effects circuit 225A and 225B may include any number of guitar and or studio processors. The output of the right effects circuit 225A is fed to the input 246A of the noise reduction system 220, buffered by the buffer amplifier 247A and fed to the channel 1 audio path 249A. The output 251A of the channel 1 audio path 249A is connected to the input of the right amplifier 226A of the stereo guitar system 220. The output of the left effects circuit 225B is fed to the input 246B of the noise reduction system 220, buffered by the buffer amplifier 247B and fed to the channel 2 audio path 240B. The output 251B of the channel 2 audio path 249B is connected to the input of the left amplifier 226B of the stereo guitar system 220. The outputs of the right and left amplifiers 226A and 226B are connected to speakers 227A and 227B, respectively, to provide audible sound for the guitar system.

Continuing to look at FIG. 4, in operation the output of the guitar 10 is buffered and fed to both the input of the level detector 255 and the input of the stereo guitar system 220. This allows the stereo guitar system 220 to process the guitar signal and generate stereo output signals to feed the two audio path inputs 246A and 246B of the noise reduction system 220. The user adjustable threshold 261 will be set based on the type of guitar used and preferences of the guitarist using the system. Once the threshold is set the user can make changes to the guitar preamp 23 as well as the right and the left effects circuits 225A and 225B without any required changes in the threshold adjustment 261. A further advantage of this embodiment is that the level detector 255 will detect the full dynamic range available from the guitar 10, making the operation of both the channel 1 and channel 2 noise reduction circuits far more responsive to the guitar signal than would be possible with prior art systems. The embodiment shown in FIG. 4 may also include the teachings of my '305 patent, which will make the release response characteristic of the noise reduction system 220 responsive to the decay envelope of the guitar 10 and will also add considerable transparency to the noise reduction system 220.

Thus, it is apparent that there has been provided, in accordance with the invention, a disguised automobile antenna that fully satisfies the objects, aims and advantages set forth above. While the invention has been described in conjunction with specific embodiments thereof, it will be evident that many alternatives, modifications and variations will be apparent to those skilled in the art and in light of the forgoing description. Accordingly, it is intended to embrace all such alternatives, modifications and variations as fall within the spirit of the appended claims.

What is claimed is:

1. A method for reducing noise in a musical instrument sound system comprising the steps of:
    level detecting an instrument output signal to derive a dc control signal; and
    varying outputs of first and second audio paths in response to the dc control signal.

2. A method for reducing noise in a musical instrument sound system comprising the steps of:
    level detecting an instrument output signal to derive a first dc control signal;
    level detecting the instrument output signal to derive a second dc control signal;
    varying an output of a first audio path in response to the first dc control signal; and
    varying an output of a second audio path in response to the second dc control signal.

3. A method for reducing noise in a musical instrument sound system comprising the steps of:
    level detecting an instrument output signal to derive a dc control signal;
    feeding the instrument output signal via a first audio path to an instrument amplifier having an effects loop circuit connected to a second audio path; and
    varying outputs of the first and second audio paths in response to the dc control signal.

4. A method according to claim 3 further comprising the step of permitting user variation of a threshold for level detecting the instrument output signal.

5. A method for reducing noise in a musical instrument sound system comprising the steps of:
    level detecting an instrument output signal to derive a first dc control signal;
    level detecting the instrument output signal to derive a second dc control signal;
    feeding the instrument output signal via a first audio path to an instrument amplifier having an effects loop circuit connected to a second audio path;
    varying an output of the first audio path in response to the first dc control signal; and
    varying an output of the second audio path in response to the second dc control signal.

6. A method according to claim 5 further comprising the steps of:
    permitting user variation of a threshold for level detecting the instrument output signal to derive the first dc control signal; and
    permitting user variation of a threshold for level detecting the instrument output signal to derive the second dc control signal.

7. A method for reducing noise in a musical instrument sound system comprising the steps of:
    level detecting an instrument output signal to derive a dc control signal;
    feeding the instrument output signal to an instrument amplifier having a right effects loop circuit connected to a first audio path and a left effects loop circuit connected to a second audio path; and
    varying outputs of the first and second audio paths in response to the dc control signal.

8. A method according to claim 7 further comprising the step of permitting user variation of a threshold for level detecting the instrument output signal.

9. A musical instrument sound system noise reduction circuit comprising:
    means for detecting a level of an instrument output signal to derive a dc control signal; and means for varying outputs of first and second audio paths in response to said dc control signal.

10. A musical instrument sound system noise reduction circuit comprising:
   first means for detecting a level of an instrument output signal to derive a first dc control signal;
   second means for detecting said level of said instrument output signal to derive a second dc control signal;
   first means for varying an output of a first audio path in response to said first dc control signal; and
   second means for varying an output of a second audio path in response to the second dc control signal.

11. A musical instrument sound system noise reduction circuit comprising:
   means for detecting a level of an instrument output signal to derive a dc control signal;
   a first audio path feeding said instrument output signal to a means for amplifying said instrument output signal, said amplifying means having an effects loop circuit connected to a second audio path; and
   means for varying outputs of said first and second audio paths in response to said dc control signal.

12. A circuit according to claim 11 further comprising means for permitting a user to vary a threshold of said level detecting means.

13. A musical instrument sound system noise reduction circuit comprising:
   first means for detecting a level of an instrument output signal to derive a first dc control signal;
   second means for detecting said level of said instrument output signal to derive a second dc control signal;
   a first audio path feeding said instrument output signal to a means for amplifying said instrument output signal, said amplifying means having an effects loop circuit connected to a second audio path;
   first means for varying an output of said first audio path in response to said first dc control signal; and
   second means for varying an output of said second audio path in response to said second dc control signal.

14. A circuit according to claim 13 further comprising:
   first means for permitting a user to vary a threshold of said first level detecting means; and
   second means for permitting the user to vary a threshold of said second level detecting means.

15. A musical instrument sound system noise reduction circuit comprising:
   means for detecting a level of an instrument output signal to derive a dc control signal;
   means for amplifying said instrument output signal, said amplifying means having a right effects loop circuit connected to a first audio path and a left effects loop circuit connected to a second audio path; and
   means for varying outputs of said first and second audio paths in response to the dc control signal.

16. A circuit according to claim 15 further comprising means for permitting a user to vary a threshold of said level detecting means.

* * * * *